(12) United States Patent
Chitrapu et al.

(10) Patent No.: US 8,036,325 B2
(45) Date of Patent: Oct. 11, 2011

(54) WIRELESS COMMUNICATION METHOD AND APPARATUS FOR PERFORMING KNOWLEDGE-BASED AND BLIND INTERFERENCE CANCELLATION

(75) Inventors: Prabhakar R. Chitrapu, Blue Bell, PA (US); Steven Jeffrey Goldberg, Downingtown, PA (US)

(73) Assignee: Interdigital Technology Corporation, Wilmington, DE (US)

( * ) Notice: Subject to any disclaimer, the term of this patent is extended or adjusted under 35 U.S.C. 154(b) by 1138 days.

(21) Appl. No.: 11/531,515

(22) Filed: Sep. 13, 2006

(65) Prior Publication Data

US 2007/0211836 A1    Sep. 13, 2007

Related U.S. Application Data

(60) Provisional application No. 60/780,711, filed on Mar. 9, 2006.

(51) Int. Cl.
*H03D 1/04* (2006.01)
*H03D 1/06* (2006.01)
*H03K 5/01* (2006.01)
*H03K 6/04* (2006.01)
*H04B 1/10* (2006.01)
*H04L 1/00* (2006.01)
*H04L 25/08* (2006.01)

(52) U.S. Cl. ........ 375/346; 327/310; 327/384; 327/551; 348/607; 455/296

(58) Field of Classification Search ........................ None
See application file for complete search history.

(56) References Cited

U.S. PATENT DOCUMENTS

| | | | | |
|---|---|---|---|---|
| 6,959,065 | B2 * | 10/2005 | Sparrman et al. | 376/346 |
| 7,215,726 | B2 * | 5/2007 | Meyer et al. | 375/347 |
| 7,627,052 | B2 * | 12/2009 | Goldberg | 375/267 |
| 2003/0160896 | A1 | 8/2003 | Ho Kim | |
| 2004/0171364 | A1 * | 9/2004 | Pukkila | 455/226.1 |
| 2005/0153663 | A1 * | 7/2005 | Pan et al. | 455/78 |
| 2007/0183483 | A1 * | 8/2007 | Narayan et al. | 375/148 |
| 2008/0019434 | A1 * | 1/2008 | Kim et al. | 375/232 |

(Continued)

OTHER PUBLICATIONS

Huovinen et al., *Blind Source Separation Based Successive Interference Cancellation in the DS-CDMA Uplink*, Control. Communications and Signal Processing, 2004. First International Symposium on Hammamet, pp. 775-778, (Mar. 2004).

(Continued)

*Primary Examiner* — Shuwang Liu
*Assistant Examiner* — Gina McKie
(74) *Attorney, Agent, or Firm* — Volpe and Koenig, P.C.

(57) ABSTRACT

A method and apparatus for cancelling interference in received signals are disclosed. A receiver includes a knowledge-based interference cancellation unit, a blind interference cancellation unit and a trade-off management unit. The knowledge-based interference cancellation unit cancels interference in the received signals based on pre-known knowledge and the blind interference cancellation unit cancels interference in the received signals without the pre-known knowledge. The trade-off management unit determines a trade-off between knowledge-based interference cancellation and blind interference cancellation, whereby at least one of the knowledge-based interference cancellation and the blind interference cancellation is selectively preformed based on the trade-off. The interference cancellation may be performed by implementing at least one of a successive interference cancellation (SIC), a principal component analysis (PCA) and an independent component analysis (ICA). The knowledge-based and the blind interference cancellation may be performed in parallel, in series or in any combination.

5 Claims, 4 Drawing Sheets

U.S. PATENT DOCUMENTS

2009/0154620 A1* 6/2009 Mostafa .................. 375/346
2009/0310586 A1* 12/2009 Shatti ..................... 370/338

OTHER PUBLICATIONS

Huovinen et al., *DS-CDMA Capacity Enhancement Using Blind Source Separation Based Group-Wise Successive Interference Cancellation*, 2004 IEEE 5$^{th}$ Workshop on Signal Processing Advance in Wireless Communications, pp. 184-188, (Jul. 2004).

Huovinen et al., *Independent Component Analysis Using Successive Interference Cancellation for Oversaturated Data*, European Transactions on Telecommunications, vol. 17, No. 5, pp. 577-589, (Oct. 2005).

Li et al., *Blind Digital Signal Separation Using Successive Interference Cancellation Iterative Least Squares*, IEEE Transactions on Signal Processing, vol. 48, No. 11, (Nov. 2000).

Ristaniemi et al., *Inter-Cell Interference Cancellation in CDMA Array Systems by Independent Component Analysis*, Department of Mathematical Information Technology, University of Jyväskylä, Neural Networks Research Centre, Helsinki University of Technology, (2003).

* cited by examiner

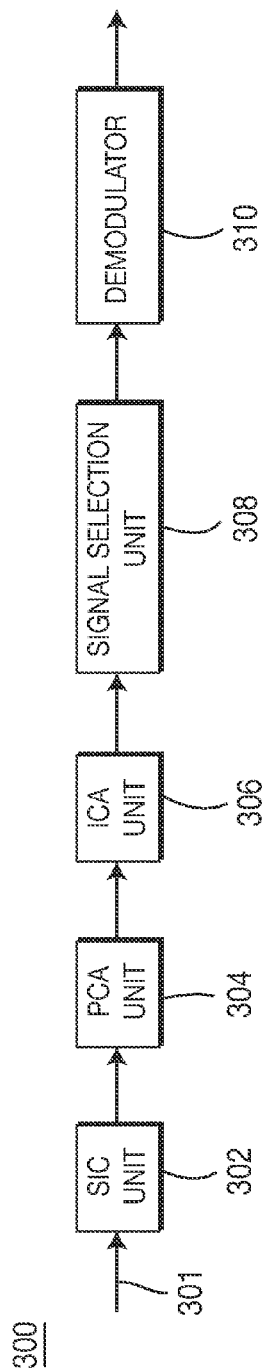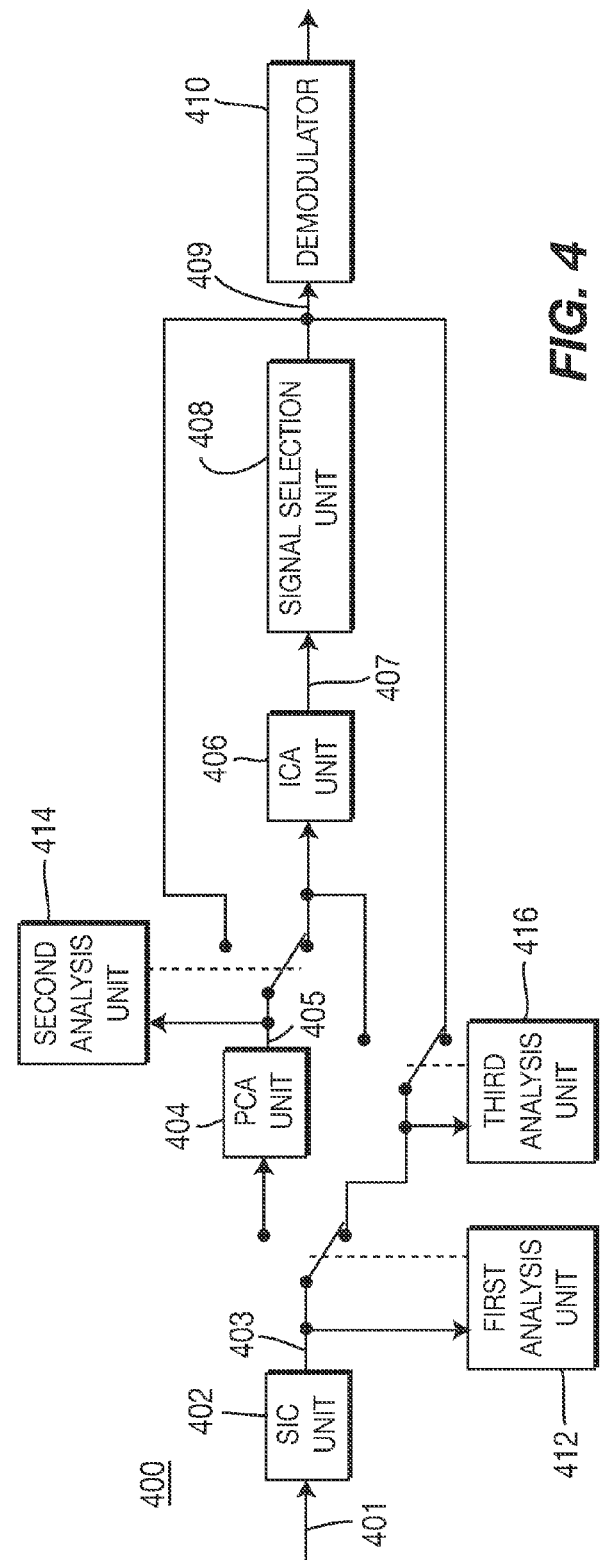

WIRELESS COMMUNICATION METHOD AND APPARATUS FOR PERFORMING KNOWLEDGE-BASED AND BLIND INTERFERENCE CANCELLATION

CROSS REFERENCE TO RELATED APPLICATION

This application claims the benefit of U.S. Provisional Application No. 60/780,711 filed Mar. 9, 2006, which is incorporated by reference as if fully set forth.

FIELD OF INVENTION

The present invention is related to signal processing. More particularly, the present invention is related to a method and apparatus for cancelling interference from received signals by performing knowledge-based and blind interference cancellation.

BACKGROUND

In a wireless communication system, a receiver receives signals which include both signals intended for the specific receiver and signals intended for other receivers operating within the same frequency band. The signals intended for other receivers are referred to as interference. There are also sources of noise which produce signals that are not used for communication, but are received by the specific receiver as well. The general formula for a received signal incident to an antenna element is expressed as follows:

$$x = s + \Sigma I_i + \Sigma n_k;  \quad \text{Equation (1)}$$

where x is sum of signals of all types, s is signal of interest, $\Sigma I_i$ is interference due to other communication signals of known characteristics and $\Sigma n_k$ is noise due to sources of unknown characteristics.

The capacity of a communication channel is limited by the Shannon's formula:

$$C = W \log_2(1 + S/N);  \quad \text{Equation (2)}$$

where C is capacity in bits per second, W is channel bandwidth in Hertz, S is the desired signal power and N is the power of all components not of interest which includes interference and noise.

The signal-to-noise ratio, S/N, in Equation (2) can be replaced by a signal-to-interference plus noise ratio (SINR) which is defined as follows:

$$SINR = \frac{\text{Communication\_Signal\_Of\_Interest}^2}{\Sigma \text{All\_Other\_Communication\_Signals}^2 + \Sigma \text{All\_Noise\_Signals}^2} \quad \text{Equation (3)}$$

$$= \frac{s^2}{\Sigma I_i^2 + \Sigma n_k^2};$$

The channel capacity is therefore $C = W \log_2(1 + SINR)$. Assuming a fixed allocation of bandwidth, W, it would be desirable to increase the value of SINR in order to maximize the capacity of the communication channels.

A conventional approach to increase the value of SINR is to exploit known characteristics of the signals by extracting them from the received signals, (i.e., non-blind technique). Training sequences are often used to allow the receiver to determine how to differentiate the signal of interest from all other signals. While the signal of interest may be the desired signal for further processing, (e.g., data extraction or location determination), the signal of interest may be one of the other signals in the received signal sum. In the latter case, determining such a signal may facilitate its subtraction from the received signals, leading to a more robust extraction of the desired signal for utilization. When available, this type of processing is often the preferred approach to extract the desired signal, subject to other system level considerations such as computational complexity, channel variation, or the like.

Successive interference cancellation (SIC) is an example of a non-blind interference cancellation technique. The SIC is based on knowledge of the signals that is either known or determined. FIG. 1 shows an exemplary conventional receiver 100 implementing SIC. In the receiver 100, received baseband data 101 is stored in a buffer 102. Interference is subtracted from the stored received baseband data, or the baseband data is 'orthogonally-projected' to the interference signals. The processed data output of the buffer 102 is multiplied with a scrambling code conjugate by a plurality of multipliers 104A-104L and correlated with L codes by a plurality of fast Walsh transformers (FWTs) 106A-106L. The outputs from the FWTs 106A-106L are combined by a maximal ratio combiner (MRC) 108. One of N outputs is selected by a decision unit 110 as an output and maximum M values selected by a selection unit 112 from N-1 outputs are fed back to the buffer 102 via a signal regeneration unit 114 which cancels the M signals as interference. The M signals are spread again by spreaders 116a-116M and summed by a summer 118. The summed signal is multiplied with a scrambling code by a multiplier 120 and the multipath channel signal is regenerated by the signal regenerator 122. The regenerated signal is subtracted from the received data 101 stored in the buffer 102 as the interference.

Another conventional approach to signal extraction is a class of signal processing referred to as blind signal processing. The term "blind" refers to the fact that the signals are separated without some information required by the conventional techniques exploiting known characteristics of the signals. For example, a lack of a training sequence or inability to decode it due to excessive signal distortion does not allow comparison of a known signal to a received signal. Therefore, the channel effects on the transmitted signal can not be directly determined.

Blind signal separation techniques get around this lack of information by exploiting information that still exists in the various signal types. One such type of information is the moment of a signal. Different communications stream sources impart different values to these moments. By maximizing a cost function based on the unique values of these parameters due to each signal, a separation matrix may be determined which will extract each signal from the mixture. Independent component analysis (ICA) and principle component analysis (PCA) are examples of blind signal separation methods.

Both the non-blind and blind techniques have their appropriate applications. When there is knowledge concerning the signal components, a non-blind technique is usually the more robust one to utilize, although the blind technique may also work. When the knowledge is not available, the blind technique should be used.

The non-blind and blind techniques have been jointly employed in receive processing only to a limited degree. One example is outlined in a paper entitled "Inter-Cell Interference Cancellation in CDMA Array Systems by Independent Component Analysis", (available from web site http://www.kecl.ntt.co.jp/icl/signal/ica2003/). FIG. 2 is a block diagram of a receiver 200 in accordance with this approach. In FIG. 2, signal aggregates from different cells are separated by an ICA unit 202. A separated aggregate containing the data for the receiver 200 is then selected by a selection unit 204 and the selected data alone is fed to a first Rake processing block 206 which is a non-blind approach as it exploits the spreading codes. The selection unit 204 is necessary since the ICA processing can output the separated signals in an initially unknown order. The selection unit 204 performs a minimal amount of processing to identify the target stream. For example, this may be performed by decoding a portion of the stream which should produce a known sequence of data, or have a specific set of signal characteristics. The stream which best satisfies the criteria is selected by the selection unit 204. The received signal may be processed only by a second Rake processing block 208 via a pre-switch 210 and a post switch 212. The two Rake processing blocks 206, 208 may be the same processing block.

While this approach is beneficial, it does not always work as exemplified by the figure illustrating the selection of its use or the avoidance of the ICA portion of the processing. This is because under certain circumstances the ICA processing actually has a detrimental overall effect on the extracted signal quality. An example of this problem is when the product of the separation matrix and the noise exceeds the gains from the separation of the signals. Therefore, a means to obtain consistent and robust SINR improvements is desirable.

SUMMARY

The present invention is related to a method and apparatus for cancelling interference in received signals. A receiver includes a knowledge-based interference cancellation unit, a blind interference cancellation unit and a trade-off management unit. The knowledge-based interference cancellation unit cancels interference in the received signals based on pre-known knowledge and the blind interference cancellation unit cancels interference in the received signals without the pre-known knowledge. The trade-off management unit determines a trade-off between knowledge-based interference cancellation and blind interference cancellation, whereby at least one of the knowledge-based interference cancellation and the blind interference cancellation is selectively preformed based on the trade-off. The interference cancellation may be performed by implementing at least one of an SIC, a PCA and an ICA. The knowledge-based and the blind interference cancellation may be performed in parallel, in series or in any combination. A semi-blind interference cancellation unit may be further provided to perform a semi-blind technique for interference cancellation.

BRIEF DESCRIPTION OF THE DRAWINGS

FIG. 3 is a block diagram of a receiver for cancelling interference in accordance with one embodiment of the present invention.

FIGS. 4 and 5 are block diagrams of a receiver configured to selectively implement interference cancellation in accordance with another embodiment of the present invention.

DETAILED DESCRIPTION OF THE PREFERRED EMBODIMENTS

Figure 1:
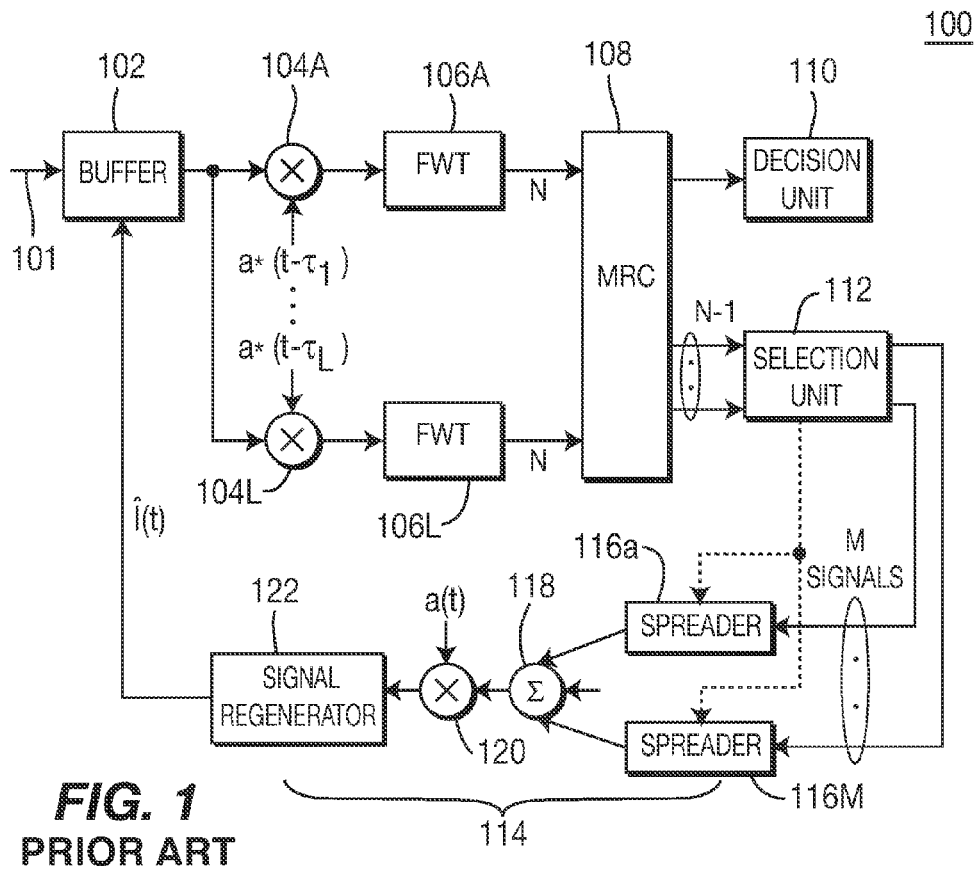
FIG. 1 is a block diagram of a conventional receiver implementing blind and non-blind interference cancellation.
Figure 2:
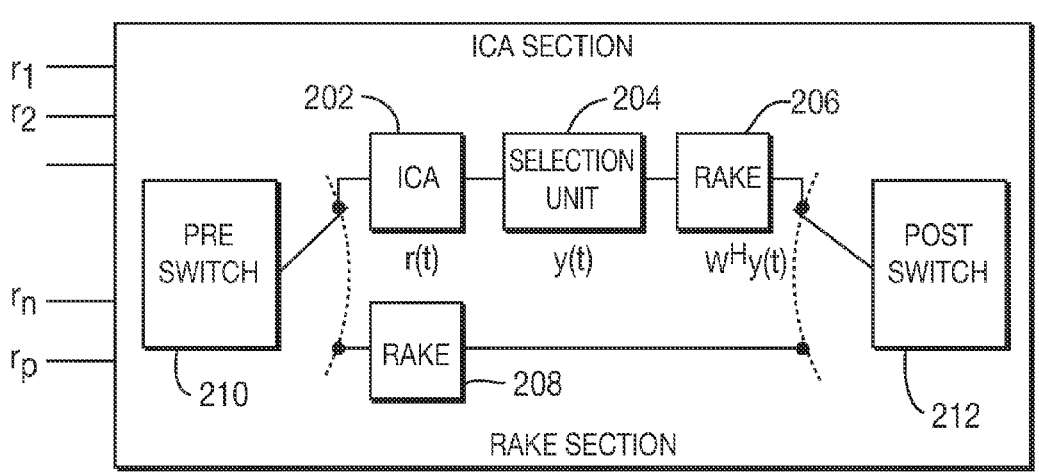
FIG. 2 is a block diagram of a conventional receiver implementing SIC.

The present invention may be implemented in any type of wireless communication system, as desired. By way of example, the present invention may be implemented in any type of IEEE 802 system, wideband code division multiple access (WCDMA), universal mobile telecommunication system (UMTS)-frequency division duplex (FDD), UMTS-time division duplex (TDD), time division synchronous code division multiple access (TDSCDMA), CDMA2000, orthogonal frequency division multiplex (OFDM)-multiple-input multiple-output (MIMO) or any other type of wireless communication system.

The present invention may also be implemented as a digital signal processor (DSP), or on an integrated circuit (IC), such as an application specific integrated circuit (ASIC), multiple ICs, logical programmable gate array (LPGA), discrete components, or a combination of DSP, ICs, LPGAs, and discrete components. The use and combination of devices is a tradeoff of space, cost, interconnection complexity, manufacturing issues, power consumption, and processing requirements.

The present invention may be implemented as a wireless transmit/receive unit (WTRU) or a base station. The terminology "WTRU" includes but is not limited to a user equipment (UE), a mobile station, a fixed or mobile subscriber unit, a pager, or any other type of device capable of operating in a wireless environment. The terminology "base station" includes but is not limited to a Node-B, a site controller, an access point (AP) or any other type of interfacing device in a wireless environment.

FIG. 3 is a block diagram of a receiver 300 for cancelling interference in accordance with one embodiment of the present invention. The receiver 300 includes an SIC unit 302, a PCA unit 304, an ICA unit 306, a signal selection unit 308 and a demodulator 310, where SIC, PCA and ICA are performed in series.

The received signals 301 are first processed by the SIC unit 302 to cancel interference using an SIC technique. SIC is an iterative process for cancelling interference from received signals and may be terminated upon one of the following conditions:

1. the number of signals that the receiver 300 is able to identify from the received signals 301 has been exhausted;
2. additional signals can be identified, but their power levels are too close to allow accurate removal; or
3. the quality of the interference cancelled signal has reached to an adequate level for signal to be passed to a demodulation process.

The third condition means that there is no need to perform additional interference cancellation and therefore a subsequent blind interference cancellation, (i.e., PCA and ICA), may not be performed. However, in the case of the first and second conditions, there is a room for further enhancement by performing a subsequent blind interference cancellation. In such case, the PCA unit 304 processes the output of the SIC unit 302 and the ICA unit 306 may further process the output from the PCA unit 304 to further improve the SINR of the received signals 301. The signal selection unit 308 selects one of a plurality of signals from the output of the ICA unit 306 and forwards the selected signal to the demodulator 310 for further processing.

A blind interference cancellation method, (such as PCA or ICA), separates unknown signals based on iterative decorrelation (first and second moments in the case of PCA and third and fourth moments in the case of ICA) to a cost function. The ICA has the additional benefit of being able to remove a Gaussian signal. If the number of signals is sufficient in number and mixing, they often appear as a single Gaussian signal as indicated by the central limit theorem. In such a case, the signal aggregate will actually be separable. It should be noted that the SIC is provided as an example and any other knowledge-based interference cancellation means may be implemented.

FIG. 4 is a block diagram of a receiver 400 configured to selectively implement interference cancellation in accordance with another embodiment of the present invention. The receiver 400 includes an SIC unit 402, a PCA unit 404, an ICA unit 406, a signal selection unit 408, a demodulator 410, a first analysis unit 412, a second analysis unit 414 and a third analysis unit 416. Certain functions may be advantageous to avoid under certain circumstances. For example, PCA, which is a whitening technique, tries to maximally decorrelate the signal vectors making up the sum from the noise signals. However, the whitening often increases the noise level. Therefore, in some cases, it is favorable to skip the PCA process.

After the received signals 401 are processed by the SIC unit 402, the first analysis unit 412 determines whether it is advantageous to perform PCA. If the determination is positive, the interference cancelled signal 403 by the SIC unit 402 is sent to the PCA unit 404. After the signal 403 is processed by the PCA unit 404, the second analysis unit 414 determines whether it is advantageous to further perform ICA. If the determination is positive, the output 405 of the PCA unit 404 is forwarded to the ICA unit 406. The ICA unit 406 separates the components of the output 405 of the PCA unit 404 and one of the components is selected by the signal selection unit 408. The selected signal 409 is then sent to the demodulator 410 for demodulation. If the first analysis unit 412 determines that the PCA is not advantageous, the third analysis unit 416 further determines whether it is advantageous to process ICA on the output 403 of the SIC 402. If the determination is positive, the output 403 of the SIC unit 402 is sent to the ICA unit 406 for signal cancellation using ICA.

Figure 5:
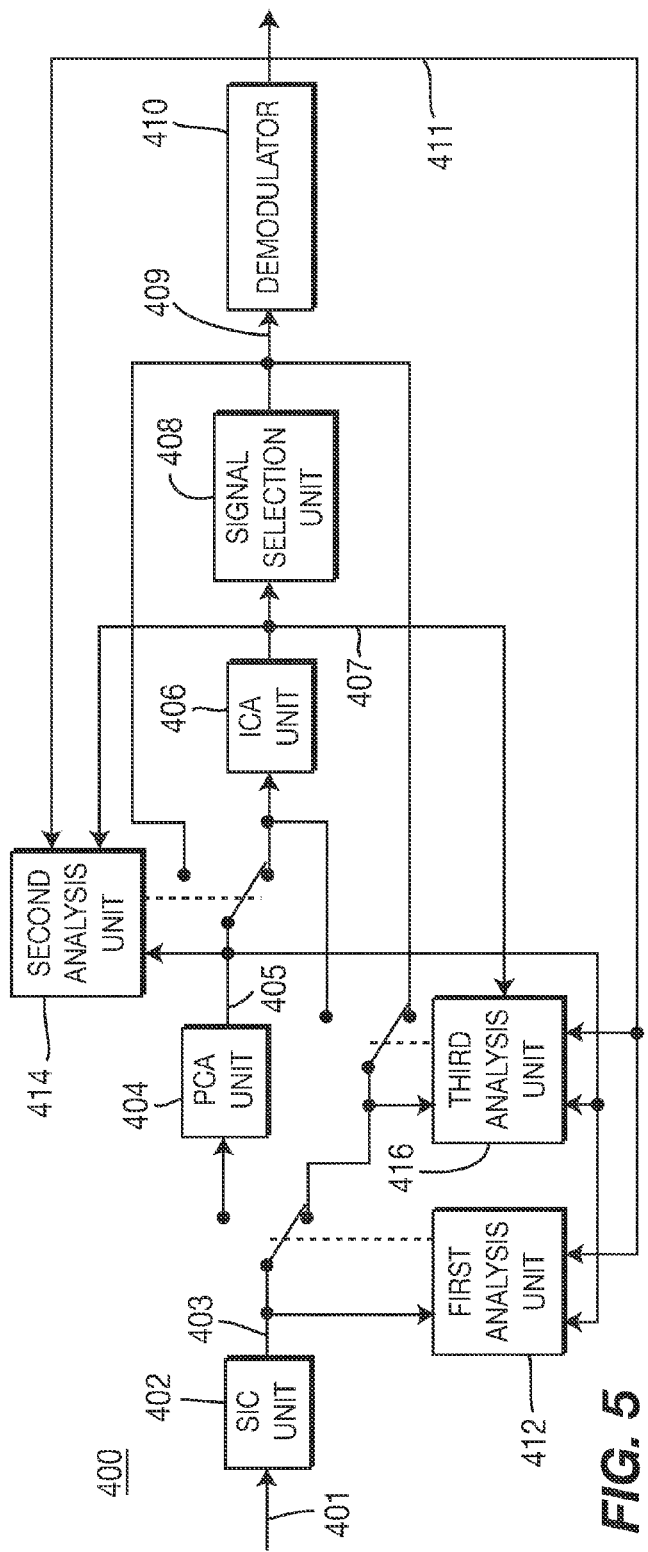

The determination by the analysis units 412, 414, 416 may be based on the remaining signal sum, (i.e., output from the previous processing units). Alternatively, as shown in FIG. 5, the determination may be based on feedback from subsequent processing units and demodulated signals 411 made by the demodulator 410. As shown in FIG. 5, the first analysis unit 412 compares the output 403, the output 405 from the PCA unit 404 and the demodulated signals 411. The second analysis unit 414 compares the output 405 from the PCA unit 404, the output 407 from the ICA unit 406 and demodulated signals 411. The third analysis unit 416 compares the output 405 from the PCA unit 404, the output 407 from the ICA unit 406 and the demodulated signals 411. The signal comparisons may be performed by a number of different techniques. For example, the signals may be compared to determine if they have essentially changed before and after the processing units. A lack of significant change indicates the processing unit is likely unnecessary. Alternatively, the signal may be fed back along the processing chain. For instance, the demodulated data has usually been processed by error correction techniques. The number of errors encountered may be the feed back data. By monitoring the data error rate in conjunction with the usage of a particular processing unit, it may be determined if the processing unit should be used or not.

Some or all of the comparisons performed by the analysis units 412, 414, 416 may not be implemented and subsequent steps, (e.g., PCA and/or ICA), may be automatically performed without such comparisons. This is because the overhead involved with making the decision may be excessive; the decision may not be reasonably made under specific conditions; the logic to perform the decision may not be an effective trade-off of implementation requirements versus anticipated results; or due to timing restrictions it is desirable to perform the subsequent processing whether or not it is beneficial.

Figure 6:
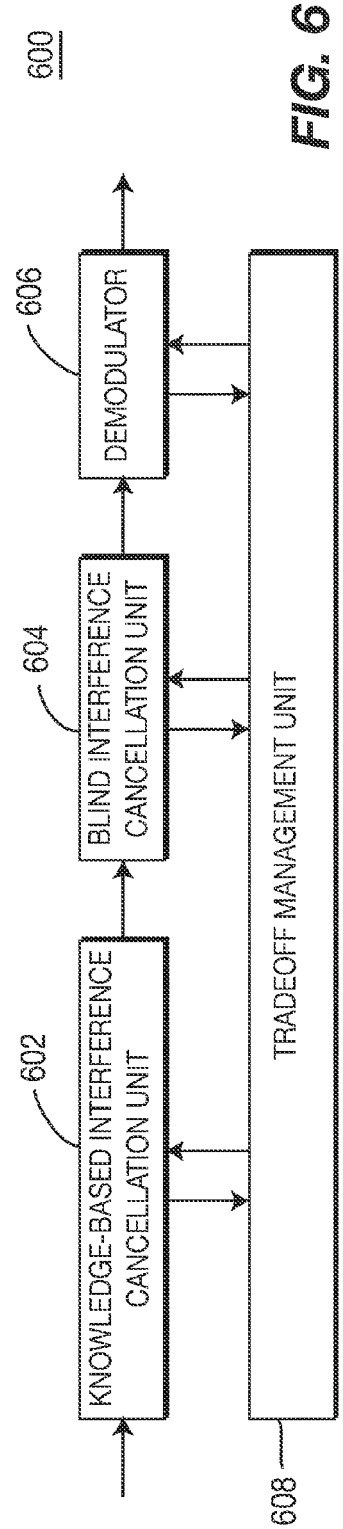
FIG. 6 is a block diagram of a receiver configured to perform knowledge-based and blind interference cancellation selectively in accordance with another embodiment of the present invention.

FIG. 6 is block diagram of a receiver 600 configured to perform knowledge-based interference cancellation and blind interference cancellation selectively in accordance with another embodiment of the present invention. The receiver 600 includes a knowledge-based interference cancellation unit 602, a blind interference cancellation unit 604, a demodulator 606 and a trade-off management unit 608. The knowledge-based interference cancellation unit 602 cancels interference based on "pre-known" knowledge and the blind interference cancellation unit 604 cancels interference without the pre-known knowledge. The knowledge-based interference cancellation unit 602 and the blind interference cancellation unit 604 are selectively turned on and off under the control of the trade-off management unit 608. The trade-off management unit 608 considers a plurality of trade-off factors and determines which interference cancellation be performed.

For example, ICA can separate out signals as one Gaussian signal under specific conditions. Therefore, it may be advantageous to defer some signal removal from the knowledge-based processing to the blind processing, even though the knowledge-based processing may handle that signal. One reason is that a premature removal of specific signals will decrease the effectiveness of the central limit theorem due to the nature of the Gaussian aggregate presented to the blind processing. Another reason is that the overhead in the knowledge-based processing is excessive compared to the blind processing.

Figure 7:
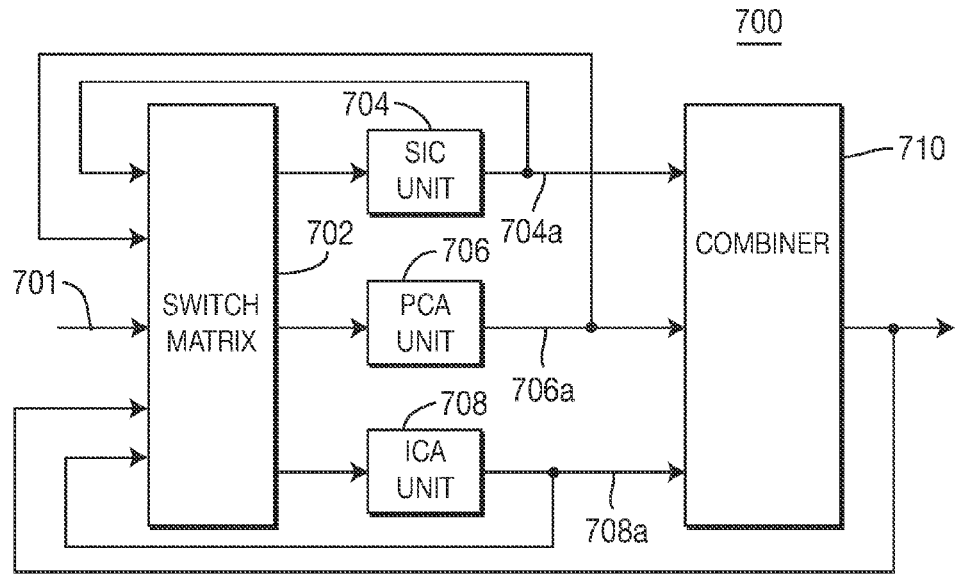
FIG. 7 is a block diagram of a receiver for selective interference cancellation in accordance with another embodiment of the present invention.

FIG. 7 is a block diagram of a receiver 700 for selective interference cancellation in accordance with another embodiment of the present invention. The receiver 700 includes a switch matrix 702, an SIC unit 704, a PCA unit 706, an ICA unit 708 and a combiner 710. Received signals 701 are fed to the switch matrix 702 and forwarded to at least one of the SIC unit 704, the PCA unit 706 and the ICA 708 via the switch matrix 702. The received signals 701 are then processed by at least one interference cancellation unit 704, 706, 708 and the interference cancelled signal 704a, 706a, 708a is forwarded to the combiner 710. Alternatively, the interference cancelled signal 704a, 706a, 708a may be fed back to the switch matrix 702 to be forwarded to another interference cancellation unit. In accordance with this embodiment, any combination of interference cancellation is possible.

For example, the switch matrix 702 may forward the received signals 701 to the SIC unit 704, the PCA unit 706 and the ICA unit 708 at the same time such that the interference cancellation, (i.e., SIC, PCA, and/or ICA) is performed in parallel on the same data. After the processing, the interference-cancelled signals 704a, 706a, 708a are then examined to determine which ones are usable and combinable, or whether feedback is required to perform another interference cancellation. Depending on the examination, the interference-cancelled signals 704a, 706a, 708a may be combined by the combiner 710 or fed back to the switch matrix 702.

Alternatively, the interference cancellation may be performed dynamically. For example, if the power levels of the signal components are not strictly in decreasing order, the interference cancellation may be performed dynamically. SIC processing may optimally identify and remove a signal if it is the dominant one remaining in the signal sum. However, if two or more signals are not sufficiently different to be separable, the blind signal separation should be applied. For example, if the order of the signal components is as follows in decreasing significance: $s_1$, $s_2 \approx s_3$, $s_4$, $s_5$, the signal $s_1$ would be removed by the SIC unit 704. However, the signals $s_2$ and $s_3$ would require blind separation either by the PCA unit 706 or the ICA unit 708 due to neither being dominant. If the rank of the mixing matrix could be set to at least four, the signals $s_4$ and $s_5$ may be separated by the ICA unit 708. However, if their characteristics are known, or the signal sums available for mixing are insufficient, $s_4$ and $s_5$ may be separated by the SIC unit 704. In such case, the signal sum after removal of signals $s_2$ and $s_3$ are routed back to the SIC unit 704 to complete the signal processing before passing the result(s) on to the combiner 710. The above description is provided merely as examples of the flexibility of the approach in accordance with the present invention and any variance may be possible.

Figure 8:
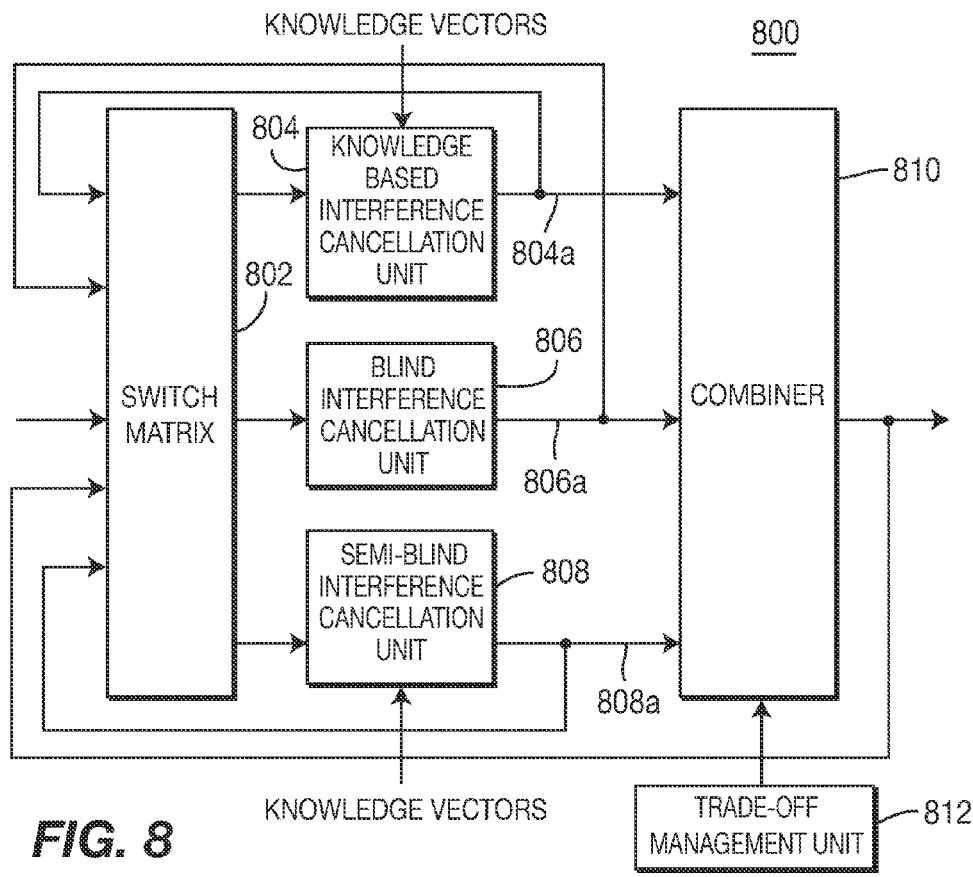
FIG. 8 is a block diagram of a receiver which is a generalized version of the receiver in FIG. 7.

FIG. 8 is a block diagram of a receiver 800 which is a generalized version of the receiver 700 in FIG. 7. The receiver 800 includes a switch matrix 802, a knowledge-based interference cancellation unit 804, a blind interference cancellation unit 806, a semi-blind interference cancellation unit 808 (optional), a combiner 810 and a trade-off management unit 812. The semi-blind interference cancellation unit 808 exploits both knowledge-based and blind techniques as appropriate. For instance, when a synchronization pattern is available, the most robust processing approach is to use it to determine the signal extraction matrix. However, if the synchronization pattern can not be identified, or is not available during particular sequence of data, a blind technique may be employed. The semi-blind interference cancellation unit 808 may therefore change from one means to another, or employ both means as appropriate. Another example of semi-blind interference cancellation is when the receiver knows that the interference is one of M known signals, but does not know which one it is. In FIG. 8, the specific processing units in FIG. 7 are replaced by classes of processors, indicating that depending on the specific applications and future approaches, other means and combinations may be supported. The trade-off management unit 812 determines how the processing should proceed based on various factors, such as the signal sum state being adequate for demodulation, latency constraints, power consumption, likelihood of further processing being beneficial, or the like.

Although the features and elements of the present invention are described in the preferred embodiments in particular combinations, each feature or element can be used alone without the other features and elements of the preferred embodiments or in various combinations with or without other features and elements of the present invention.

What is claimed is:

1. A method of cancelling interference from received signals, the method comprising:
    performing successive interference cancellation (SIC) on the received signals to generate SIC signals;
    determining whether it is desirable to perform interference cancellation using principle component analysis (PCA) on the SIC signals;
    performing interference cancellation using PCA on the SIC signals to generate PCA signals if it is determined that interference cancellation using the PCA is desirable;
    determining whether it is desirable to perform interference cancellation using independent component analysis (ICA) on the PCA signals;
    performing interference cancellation using ICA on the PCA signals to generate ICA signals if it is determined to be desirable to perform interference cancellation using ICA; and
    demodulating interference cancelled signals, wherein the determination to perform interference cancellation using PCA and the determination to perform interference cancellation using ICA are made based on a demodulated signal and an interference-cancelled signal in a previous processing.

2. An apparatus for cancelling interference from received signals, the apparatus comprising:
    a successive interference cancellation (SIC) unit for performing SIC on the received signals and outputting SIC signals;
    a principle component analysis (PCA) unit for performing interference cancellation on the SIC signals using PCA and outputting PCA signals;
    a first analysis unit configured to determine whether it is desirable to perform interference cancellation using PCA, whereby the PCA unit performs interference cancellation using the PCA on a condition that it is determined to be desirable to perform interference cancellation using PCA;
    an independent component analysis (ICA) unit for performing interference cancellation on the PCA signals using ICA and outputting ICA signals;
    a second analysis unit configured to determine whether it is desirable to perform interference cancellation using ICA, the ICA unit performing interference cancellation using the ICA on a condition that it is determined to be desirable to perform interference cancellation using ICA; and
    a demodulator for demodulating interference cancelled signals, wherein the first analysis unit makes the determination to perform interference cancellation using PCA and the second analysis unit makes the determination to perform interference cancellation using ICA based on a demodulated signal and an interference-cancelled signal in a previous processing.

3. The apparatus of claim 2 wherein the apparatus is a wireless transmit/receive unit (WTRU).

4. The apparatus of claim 2 wherein the apparatus is a base station.

5. The apparatus of claim 2 wherein the apparatus is an integrated circuit (IC).

* * * * *